United States Patent [19]
Stepanenko, Jr.

[11] Patent Number: 5,852,796
[45] Date of Patent: Dec. 22, 1998

[54] COMPUTERIZED TESTING METHOD AND SYSTEM FOR WIRE HARNESSES

[75] Inventor: Walter K. Stepanenko, Jr., St. Clair Shores, Mich.

[73] Assignee: UT Automotive Dearborn, Inc., Dearborn, Mich.

[21] Appl. No.: 751,198

[22] Filed: Nov. 15, 1996

[51] Int. Cl.⁶ .................. G01R 31/327; G01R 31/02; G01R 31/07

[52] U.S. Cl. .............. 702/176; 702/58; 702/64; 702/67; 702/79; 702/89

[58] Field of Search .................. 364/481, 483, 364/580, 487, 492, 550, 551.01, 468.02, 813, 828; 324/503, 538–539; 361/88, 93, 96–97; 363/79; 702/58, 64, 66–67, 79, 89, 176

[56] References Cited

U.S. PATENT DOCUMENTS

| | | | |
|---|---|---|---|
| 4,224,690 | 9/1980 | Rockwell | 702/117 |
| 4,245,318 | 1/1981 | Eckart et al. | 702/67 |
| 4,351,013 | 9/1982 | Matsko et al. | 361/96 |
| 4,399,400 | 8/1983 | Rockwel et al. | 324/540 |
| 5,029,274 | 7/1991 | Goff et al. | 324/66 |
| 5,231,357 | 7/1993 | Moody et al. | 324/539 |
| 5,532,927 | 7/1996 | Pink et al. | 701/34 |
| 5,548,210 | 8/1996 | Dittrich | 324/158.1 |
| 5,652,851 | 7/1997 | Stone et al. | 345/346 |

OTHER PUBLICATIONS

Walusiak: "A device for examination of time–current characteristics of fuses." Pomiary Automatyka Kontrola, vol. 30, No. 3, Mar. 1984, pp. 80–81.

Primary Examiner—James P. Trammell
Assistant Examiner—Cuong H. Nguyen
Attorney, Agent, or Firm—Howard & Howard

[57] ABSTRACT

A computerized testing method and system for a wire harness allows analog data regarding a characteristic of the wire harness to be received and converted into digital data. This digital data is analyzed, and an opening time for the wire harness is calculated. The opening time will determine if the wire harness is acceptable or unacceptable.

19 Claims, 5 Drawing Sheets

FIG.1
PRIOR ART
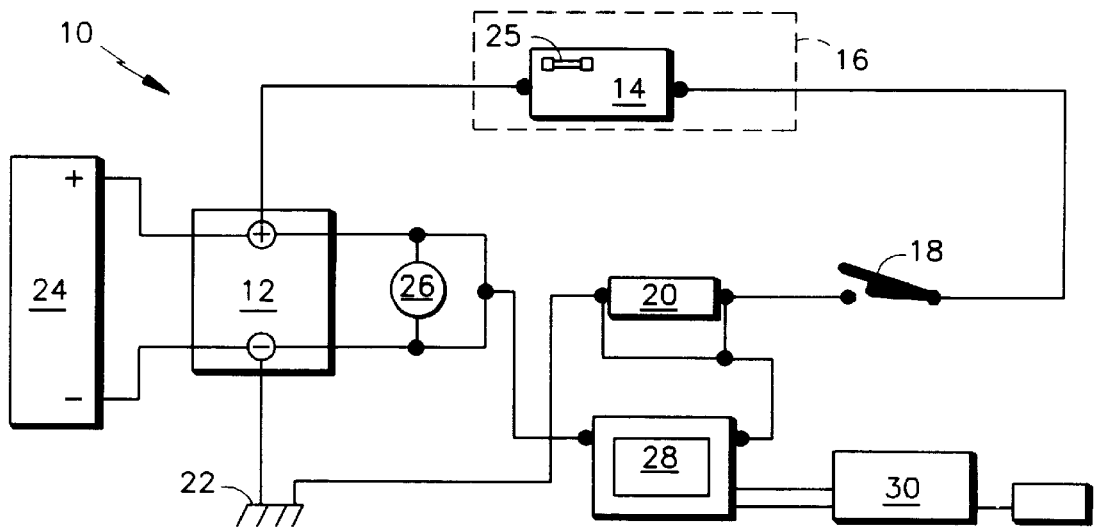
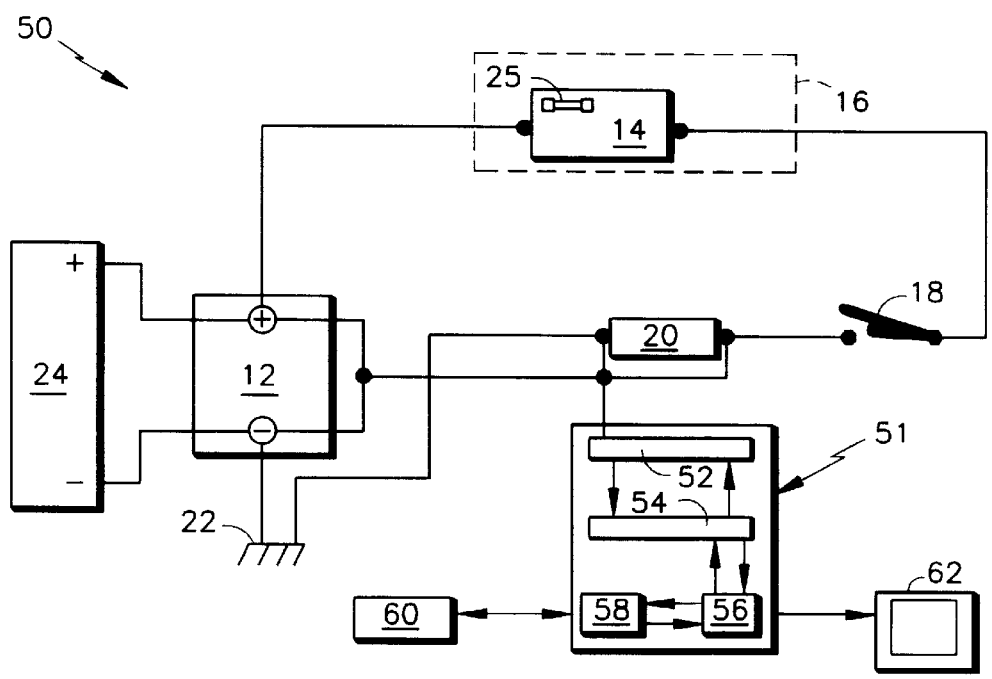
FIG.2

COMPUTERIZED TESTING METHOD AND SYSTEM FOR WIRE HARNESSES

TECHNICAL FIELD

The present invention relates to an electrical distribution system, and more particularly to a computerized method and system for testing electrical distribution systems.

BACKGROUND OF THE INVENTION

Electrical distribution systems, such as wire harnesses, are well known, and generally, comprise large bundles of wire, which interconnect electrical components of a vehicle to their respective controls and power source. In the automotive industry, the number of electrical devices and control systems in automobiles has increased. The amount of wiring has grown proportionally with the increase in electrical content within the vehicle. Furthermore, design criteria require grouping of wires based on functional properties, operating properties, and sharing a control or power source. As a result of this increase in the number of wires, as well as the design criteria, the development and manufacture of wire harnesses has grown more complex.

It is well known to include some form of circuit protection in the design of the systems. One known form is fuses. Fuses comprise a conductive material which melts when a current greater than its design rating travels through a circuit. When the circuit is overloaded, the fuse melts opening the circuit forming a short circuit, and preventing current flow. This opening is intended to occur before any components of the system are damaged.

In the industry, one time consuming phase of product development is the design verification and testing of wire harnesses. This phase includes testing all the power feed circuits of the harness to determine if the appropriate fuse responds quickly enough to an overloading current. The proper fuse response stops current flowing through the affected circuit, thereby minimizing the likelihood of damaging other components in the vehicle. There is a demand for methods and devices for speeding up this phase.

One known method of testing wire harnesses requires a technician to acquire data and calculate results. Referring to FIG. 1, the known test set-up 10 includes a battery 12 coupled with a wire harness 14, a knife switch 18, a shunt 20 and a ground 22. The test set-up further includes a power supply 24, a fuse 25 in the wire harness, a voltmeter 26, an oscilloscope 28, and a plotter 30. The fuse may be contained in a power distribution box, a fuse box or the like.

The power supply 24 is coupled to the battery 12. The power supply 24 keeps the battery 12 charged. The power supply 24 in combination with the battery 12 is the power source for the wire harness 14. The voltmeter 26 is coupled to the power source 12, and 24. The oscilloscope 26 is coupled to the shunt 20, and the power source 12 and 24.

The testing procedure is as follows. Initially the system is powered up, and the voltage of the power source is verified. Once powered, an overloading current is made to flow through the circuit by closing the knife switch. The current then flows through the wire harness being tested, whereby the overloading current causes the fuse 25 to melt.

During testing, the oscilloscope displays two wave patterns. The first pattern is indicative of the voltage across the shunt as a function of time, and one indicative of the voltage across the power source as a function of time. An operator records the voltage, and the rating of the shunt, and converts the shunt voltage values at predetermined times into current.

The operator then reads the oscilloscope and selects as a first time where the current is a maximum value, and selects as a second time where the current initially reaches zero, where the second time is greater than the first time. Then operator obtains a fuse opening time from the oscilloscope by subtracting the second time from the first time. If the fuse opening time is greater than a predetermined critical time, the fuse fails and is deemed unacceptable. If the fuse opening time is less than the critical time, the fuse passes and is deemed acceptable. The critical time which indicates passing or failing, is experimentally determined by such factors as operating temperature, for example.

As a result of these procedures, the oscilloscope plots the wave patterns. The results are then summarized to satisfy the automaker's specifications. By analyzing the fuse opening time, the circuit can be redesigned to make the fuse more responsive, where necessary.

There are several drawbacks to the above approach. First, the process is vulnerable to human error; for example, in setting-up the equipment, reading the oscilloscope, converting the voltage to current, recording the results, and transposing the data into the booklet. Error in any one of these steps may lengthen the design process unnecessarily. In addition, since different operators tend to record data in different ways, the data recordation is not standard from operator to operator, which can add confusion when interpreting the data.

Furthermore, each test can require between 10 and 15 minutes from set-up to data acquisition, calculation and recordation. Typically, since up to 500 tests may be required on a complete vehicle system, manually testing circuits significantly lengthens the development process.

Therefore, an improved method and apparatus for testing circuits is sought, which decreases human error, and increases the speed and consistency of the data collection and reporting process.

SUMMARY OF THE INVENTION

According to an embodiment of the present invention, a computerized testing method for testing a wire harness assembly is disclosed. The wire harness assembly is coupled between a shunt and a computer. The wire harness assembly has a critical time. The method comprises the steps of converting an analog response characteristic across the shunt over a time interval to a digital data set; selecting a first peak response value from the digital data set and marking a first time associated with the first peak response value; selecting a first zero value from the digital data set and marking a second time associated with the first zero value; and calculating an opening time by subtracting the second time from the first time, such that the wire harness assembly is acceptable if the opening time is less than the critical time, while the wire harness assembly is unacceptable if the opening time is greater than the critical time.

A computerized test system for testing a wire harness. The system includes a shunt, and a computer. The computer includes an analog-to-digital converter, a microprocessor and a memory device. The analog-to-digital device converts an analog response characteristic across the shunt over a time interval to a digital data set. The microprocessor is coupled to the analog-to-digital converter. The microprocessor selects values from said digital data set and calculating results based on those values. The memory device is coupled to the microprocessor. The memory device stores the digital data set.

Using the computerized test method or system decreases human error in testing wire harnesses and increases the speed and consistency of the data collection and reporting process.

BRIEF DESCRIPTION OF THE DRAWING

FIG. 1 is a block diagram of the hardware components of the prior art testing apparatus.

FIG. 2 is a block diagram of one embodiment of the hardware components of the testing apparatus for use with the present invention.

BEST MODE FOR CARRYING OUT AN EMBODIMENT OF THE INVENTION

Figure 3:
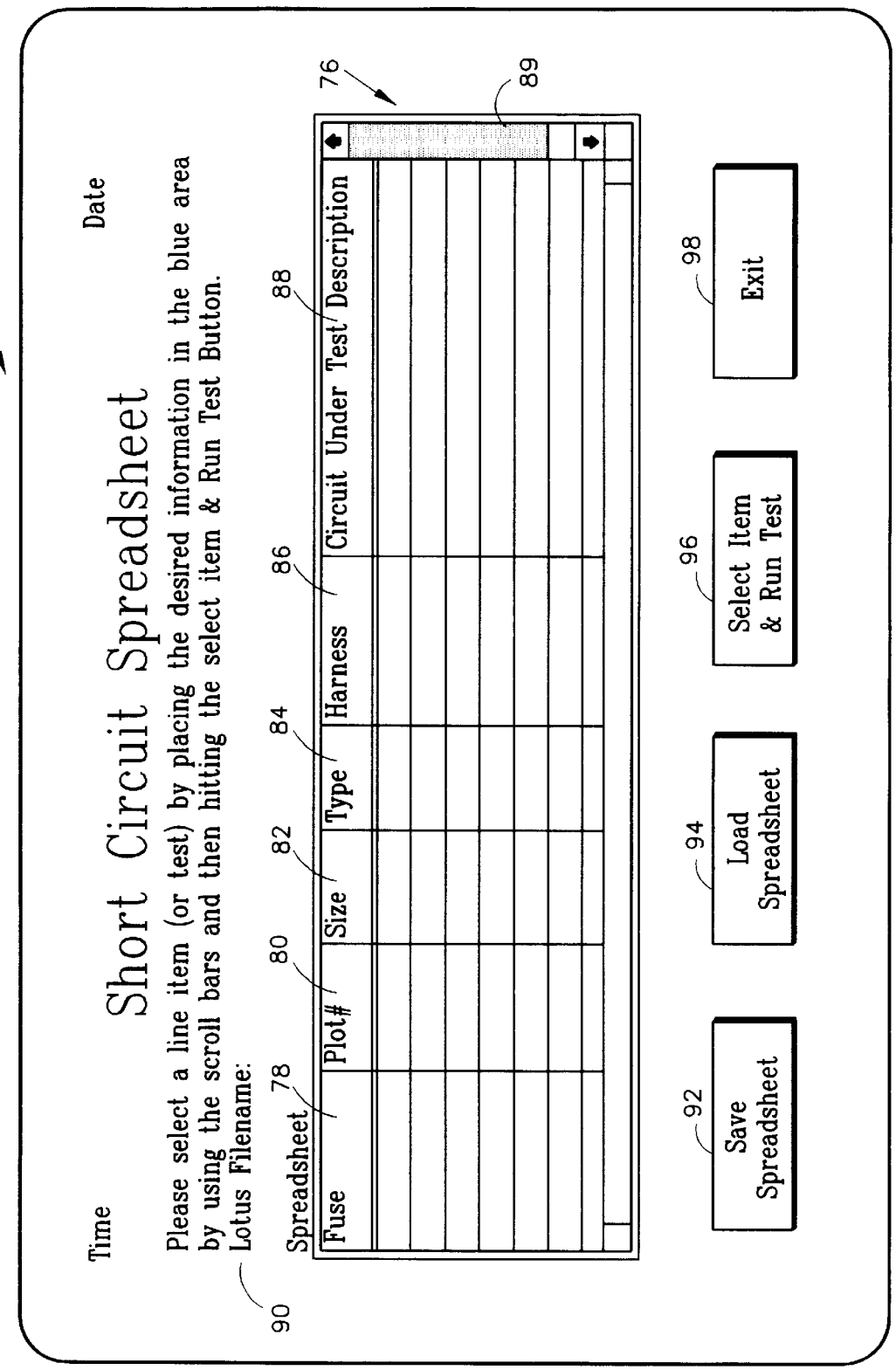
FIG. 3 is a screen display illustrating an exemplary Short Circuit Spreadsheet Window.

Referring to FIG. 2, a test set-up 50 is shown according to the present invention. Test set-up 50 replaces the oscilloscope 26 of FIG. 1 with a computer 51. The computer 51 may be, for example, an IBM compatible personal or laptop computer running Microsoft Corporation's Windows brand operating system. The computer 51 includes an analog-to-digital converter 52, a bus 54, a central processing unit 56, and a memory 58.

The analog-to-digital converter 52 is coupled to both the shunt 20 and the battery 12. In this embodiment the analog-to-digital converter 52 receives an analog response characteristic across the shunt 20 over a time interval and converts it into a digital data set. The bus 54 is coupled to the analog-to-digital converter 52 for transmitting the digital data set to the central processing unit 56. The central processing unit 56 receives, processes, and sends information to the memory 58.

The test set-up 50 further includes an input device 60, such as a keyboard and/or mouse, and an output device 62, such as a monitor. Both devices 60 and 62 communicate with the computer 51.

The analog-to-digital device 52 is commercially available. One preferred analog-to-digital device is an analog-to-digital card manufactured by National Instruments under model#/name AT-M10-16E-1 or DAQ card-AI-16E-4.

Referring to FIGS. 2 through 5, a graphical user interface is implemented by the computer 51 and appears on the monitor 62. The graphical user interface receives instruction and information relating to the wire harness 14 and allows the operator to run circuit protection tests using the computer 51.

The graphical user interface includes three windows, screens or sections 70, 72, and 74. These windows may be created using software tools which are commercially available. A preferred tool is sold by National Instruments under the name LabView for Windows, however other tools may be used.

Referring to FIG. 3, the first window 70 is a short circuit spreadsheet window. The short circuit spreadsheet window 70 allows the operator to import an ASCII text data spreadsheet having all the test parameters for a particular wire harness. The short circuit spreadsheet window 70 also allows the operator to select a particular item, like the fuse (not shown) within the wire harness, for test from the spreadsheet.

The short circuit spreadsheet window 70 has one main part, a spreadsheet matrix 76. In this embodiment, the spreadsheet matrix 76 can be regarded as a table having nineteen columns and an unlimited number of rows, however six of the columns are shown. In this embodiment, the visible columns are a fuse# column 78, a plot# column 80, a size column 82, a type column 84, a harness# column 86 and a circuit under test description column 88. The matrix 76 further includes a scroll bar 89 to the right of the table. The scroll bar 89 allows the operator to view additional rows.

The short circuit spreadsheet window 70 also has a filename area 90 above the matrix 76, and four command buttons below the matrix 76. The four command buttons are a save spreadsheet button 92, a load spreadsheet button 94, a select item & run test button 96, and an exit button 98.

Figure 4:
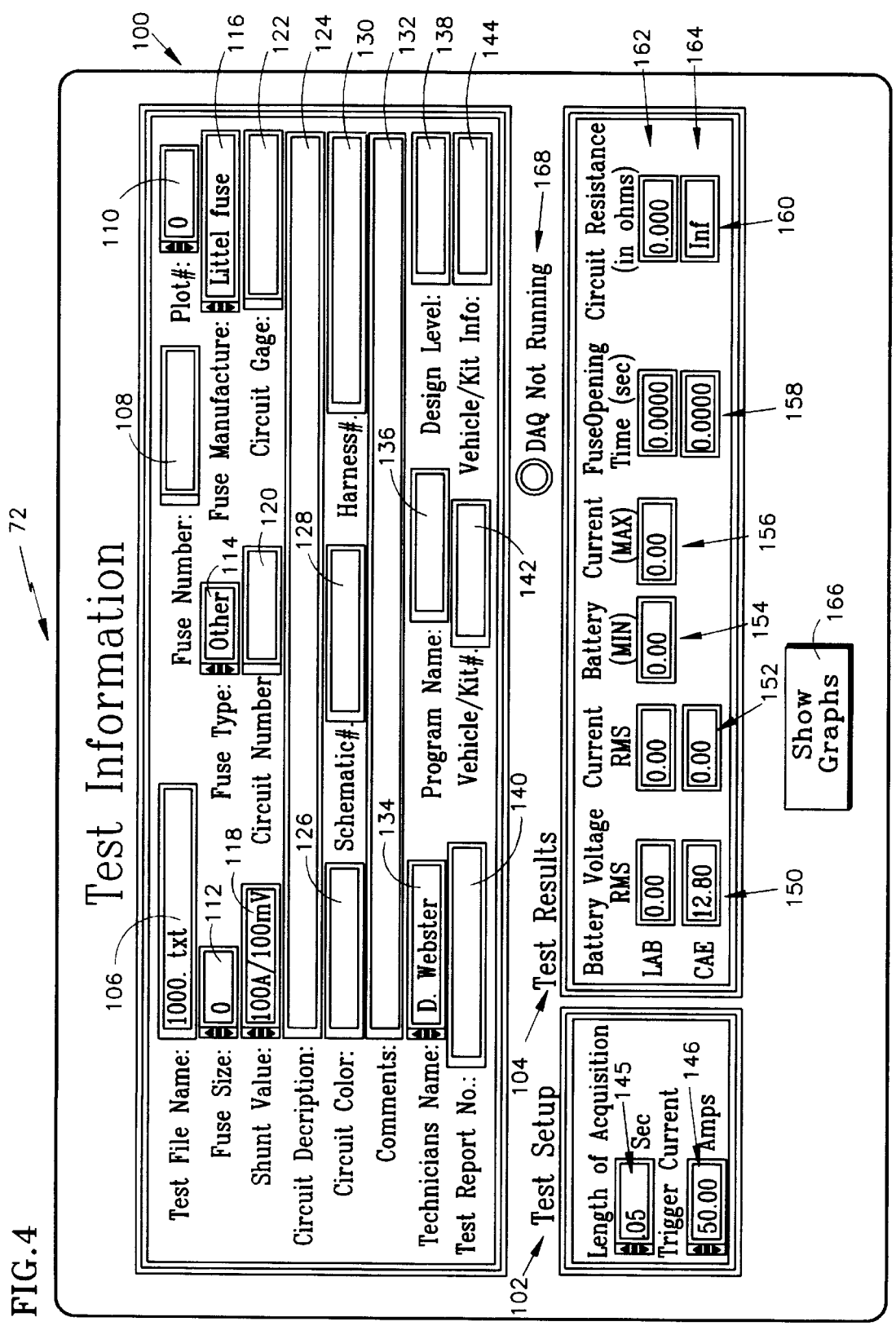
FIG. 4 is a screen display illustrating an exemplary Test Information Window.

Referring to FIG. 4, the second window 72 is a test information window. The test information window 72 allows the operator to receive, view and modify the test parameters for the item that was selected for testing. The test information window has three main parts, the test parameters area 100, the test setup area 102, and the test results area 104.

The test parameters area 100 includes a number of individual cells in which data may be entered. The cells may be dropdown or freeform boxes. Dropdown boxes give the user predetermined data choices for entry in the cell. Freeform boxes require the user to type data into the cell using the keyboard 60. The cells are as follows.

The test file name cell 106 contains the filename associated with the individual test. The fuse number cell 108 contains the number designating the fuse being tested. The plot# cell 110 contains values designating the plot number from one to infinity.

The fuse size cell 112 contains values designating all the possible fuse sizes in Amperes. The fuse type cell 114 contains values which designate all the possible fuse types. The cell 114 also offers an "other" selection for any type not listed. The fuse manufacturer cell 116 contains the names of the various manufacturers of fuses. If the appropriate manufacturer is not on the list, the operator may type the name in this cell. The shunt value cell 118 contains values, which designate all the possible shunt values in A/mV.

The circuit number cell 120 contains the circuit number from a wiring diagram. The circuit gage cell 122 contains a value indicative of the gage number of the circuit. The circuit description cell 124 contains a text description of the circuit. For example, the phrase "the circuit containing the horn," may be entered.

The circuit color cell 126 contains the color of the circuit as designated on the harness prints or electrical schematic diagrams. The information in the circuit number, circuit gage, circuit description and circuit color 120, 122, 124, and 126 cells all identify physical characteristics of the power source. The schematic# cell 128 contains the number of the electrical diagram on which the circuit being tested is drawn or shown. The harness# cell 130 contains the number identifying where the short point is located.

The comments cell 132 allows the operator to insert comments. The technician's or operator's name cell 134 contains the name of the operator testing the circuit. The program name cell 136 designates the wire harness's automobile program. The design level cell 138 identifies the wire harness's phase in the design process.

The test report no. cell 140 designates the tracking report number. The vehicle/kit# cell 142 identifies the car number, if testing is on a prototype, or the box number from which the harness came, if testing is on a free standing harness. The vehicle/kit info cell 144 includes a number indicative of the make of the car from which the harness came.

The test setup area 102 contains two dropdown cells. The length of acquisition cell 145 and the trigger current cell 146. The value in the length of acquisition cell 145 indicates how long the test will run in seconds. The trigger current cell 146 indicates the current in amps above which the computer starts recording the data.

The test results area 104 contains a table with a column for each parameter to be displayed and two rows. The columns are the battery voltage RMS (root mean squared) 150, the current RMS 152, the battery (min) 154, the current (max) 156, the fuse opening time (see) 158, and the circuit resistance (ohms) 160. The LAB row 162 displays the actual value for each parameter achieved in testing. The CAE row 164 displays the theoretical value for each parameter.

The test information window 72 further includes a show graphs command button 166 at the bottom of the window, and a DAQ Not running indicator 168 above the test results area 104.

Figure 5:
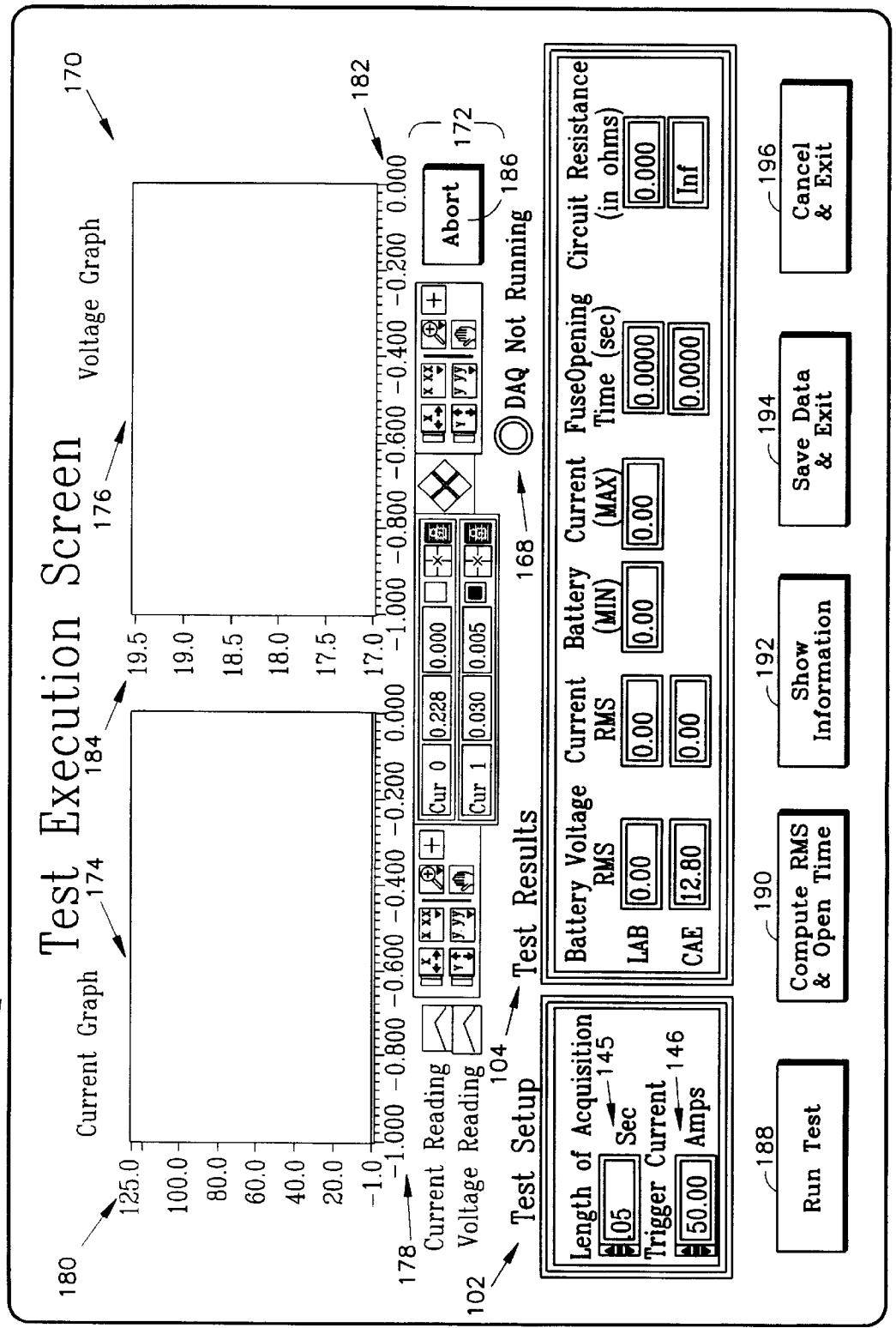
FIG. 5 is a screen display illustrating an exemplary Test Execution screen Window without graphs being displayed.

Referring to FIG. 5, the third window 74 is a test execution window. The test execution window 74 allows the operator to initiate testing, data acquisition, data recording and computing results for the item tested. The test execution window 74 includes four main areas, the graphical display area 170, the menu bar area 172, the test setup area 102, and the test results area 104.

The graphical display area 170 consists of a current graph 174 and a voltage graph 176. On the current graph 174 the display shows time in seconds along the x-axis 178 and current in amps along the y-axis 180. On the voltage graph 176 the display shows time in seconds along the x-axis 182 and voltage in volts along the y-axis 184.

In one embodiment, the menu bar area 172 below the graphical display area 170 includes various icons for manipulating the display. The test setup area 102 and the test results area 104 are the same as those discussed above.

At the bottom of the screen there are a number of command buttons including the run button 188, the compute RMS & Open Time button 190, the show information button 192, the save data & exit button 194, and the cancel & exit button 196.

The use of the testing apparatus will now be discussed. Referring to FIG. 2, the operator sets up the wire harness 14 to be tested on the test bench or within the prototype vehicle as illustrated by test set-up 50. Next the operator loads and runs the short circuit program by using the input device 60 to select the proper icon in the Windows Program Manager. The short circuit spreadsheet window 70 (as shown in FIG. 3) appears on the monitor 62.

The operator selects the load spreadsheet button 94, and the Windows File Manager Program opens. The operator selects the text file name for the proper data spreadsheet corresponding to the wire harness 14 being tested. Once selected, the file name appears in the filename area 90, and the data from the file is imported into the matrix 76. In order for the data file to be in the proper form for import from an Excel or Lotus file, the information in that file must be converted to an ASCII text file. One of ordinary skill can create macros which will convert the Excel or Lotus file into an ASCII text file in the proper form for import into the matrix 76.

The operator scrolls down the matrix 76 using the scroll bar 89 and the mouse or the keyboard 60 until the desired test item listed in the fuse# column 78 is highlighted. If at any time during the set up the operator wants to exit the program, he clicks on the exit button 98.

To continue the test, the operator selects the select item & run test button 96, which causes the test information window 72 (as shown in FIG. 4) to appear with the data from the matrix 76 in the cells of the test parameters area 100 for the selected item. The operator has the option of changing the items test information or adding additional information in the cells 106–144.

Once all the proper information is in the test parameters area 100, the operator selects the show graph button 166. This causes the test execution window 74 (as shown in FIG. 5) to appear. The operator must enter the proper values in the length of acquisition and the trigger current cells 144 and 146, respectively. If the operator wants to cancel the test and exit, he selects the cancel and exit button 196.

The DAQ Not Running indicator 168 is grey showing that the computer is not acquiring data.

Button 188 is selected, if the test is to be run. The operator then closes the knife switch 18 (as shown in FIG. 2), which causes current to flow through the test setup 50.

As the current is caused to flow through the test set up the analog-to-digital device 52 samples an analog response characteristic across the shunt over a time interval. The indicator 168 changes from grey to blue showing that the computer is waiting to acquire data, but the computer 51 is not recording data if the current is below the trigger current shown in cell 146. In this embodiment, the preferred response characteristic is the voltage across the shunt 20. The voltage can also be sampled. The central processing unit 56 checks the set of sampled data for a response greater than the trigger value. Once the trigger value is reached the indicator 168 turns red and the computer is recording data.

Once the length of acquisition, as shown in cell 144 is reached, the test ends and the indicator 168 turns grey to indicate that the computer is not acquiring data. If at any time during the set up or testing the operator wants to end the test, he selects the abort button 186.

It is preferred that contemporaneously during sampling of the response characteristic, that the response characteristic is converted into a first digital data set. The first digital data set is converted into a second digital data set indicative of the current over the time interval. The central processing unit 56 utilizes the shunt rating value in performing this conversion, which is entered into the memory 58 and transferred to the central processing unit 56, and known relationships between the shunt rating value and the current.

The computer records the data by storing the response characteristic as a function of time, the first digital data set as a function of time, and the second digital data set as a function of time in the memory 58.

Figure 6:
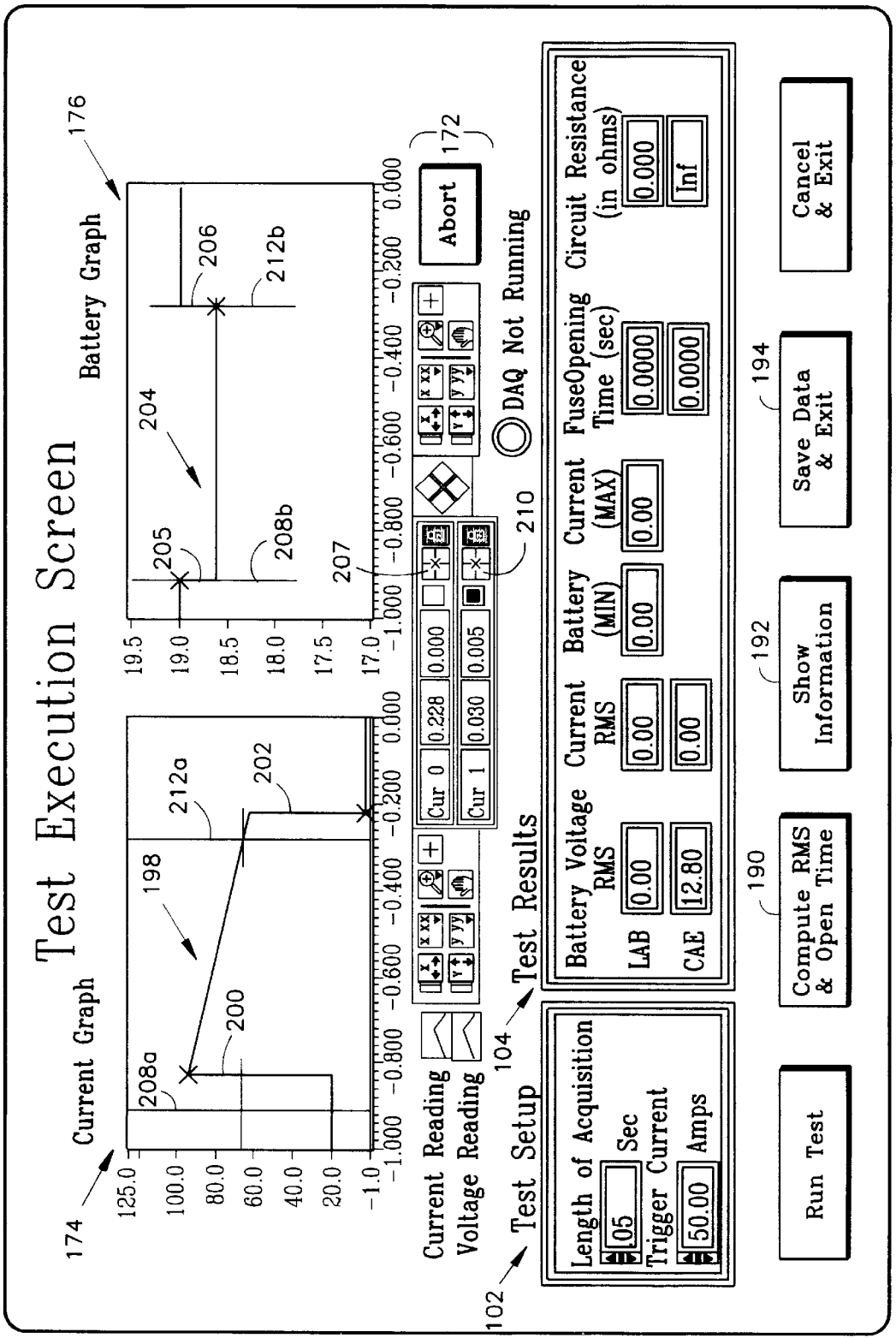
FIG. 6 is a screen display illustrating the exemplary Test Execution screen Window shown in FIG. 5 with graphs being displayed.

Referring to FIG. 6, the computer 51 generates a current pulse graph 198 having a rising end 200 and a falling end 202. The computer 51 also generates a voltage graph 204 having a pulse delineated by the two lines 205 and 206. Once the collecting process ends the operator selects a first peak response value from the first digital data set. This is done by selecting the first cursor button 207 in the menu bar area 172. Thus the first cursors 208 *a* & *b* appear on the screen. The operator aligns one of the first cursors 208*a* with the rising end 200 of the current pulse graph 198 and selects this position with the mouse 60, as such marking a first time associated therewith. This simultaneously causes the first cursor 208*b* to align at the same time on the voltage graph 204.

Then the operator selects a first zero value after the maximum value from the first digital data set. This is done by selecting the second cursor button 210 in the menu bar area 172. Thus the second current graph cursors 212 *a* & *b* appear on the screen. The operator aligns one of the second cursors 212a with the falling end 202 of the current pulse graph 198 and selects this position with the mouse 60. Thus, marking a second time associated therewith. This simultaneously causes the second cursor 212b to align at the same time on the voltage graph 204. The second time is greater than the first time.

Then the operator selects the Compute RMS & Open time button 190, which causes the computer 51 to calculate the battery voltage RMS, the current RMS, and the fuse opening time. The battery voltage RMS is an average. The current RMS is an average. The central processing unit 56 calculates an opening time by subtracting the second time from the first time. The wire harness assembly is acceptable if the opening time is less than the critical time. The wire harness assembly is unacceptable if the opening time is greater than the critical time. As a result, the aforementioned values will appear in the test results area 174.

If the operator selects the show information button 192, the test information window 72 appears (as shown in FIG. 4). Once computations are complete, the operator selects the save data & exit button 194. This saves the sampled data and results in an ASCII text file. The data and results are also automatically placed in the spreadsheet matrix 56.

Referring to FIG. 3, the short circuit spreadsheet window 70 reappears and the operator can test another test item by following the steps above. The operator can save the data after each individual test or after all the items are tested by selecting the save spreadsheet button 92. Thus, the spreadsheet with all the test results is saved to the memory 58 (as shown in FIG. 2). Then the operator selects the exit button 98 and the program ends.

In order to print the graphs or results in a standard form as they appeared in the test execution window, a macro may be written to show the data on the monitor or print it to a printer. In order to import the matrix with the test results therein into a spreadsheet, such as Excel or Lotus, one of ordinary skill in the art can import the file by using standard commands in Excel or Lotus.

The principal advantage of the computerized method and system for testing circuits is that it decreases human error. This is done by allowing a computer to make the calculations for converting the voltage to current, calculating the averages and the opening time. The graphical user interface also decreases error by having the test results in a table with easy comparison with the theoretical values. With the comparison easily accessible the operator maybe able to identify if the data is accurate to a degree. If not the operator can determine if the test set-up was incorrect and retest the appropriate component in the proper manner. This prevents design changes that are due to error in the testing and not error in the design. The graphical user interface also reduces human error by not requiring the operator to record any of the data manually which can lead to transposition, etc. problems.

Another advantage to the system is that it increases the speed and consistency of the data collection and reporting process. The data collection and reporting process are faster because the computer records all the desired information instead of having the operator handwrite the information then do the calculations then transpose the information into a report. The test file with the results can be quickly imported into an Excel file for the required summary.

While a particular invention has been described with reference to illustrated embodiments, various modifications of the illustrative embodiments, as well as additional embodiments of the invention, will be apparent to persons skilled in the art upon reference to this description without departing from the spirit and scope of the invention, as recited in the claims appended hereto. These modifications include but are not limited to programming the computer to select the first and second times by checking the second digital data set. Another modification may be having the graphical user interface comprised of fewer or greater windows as the operator desires by combining the windows shown or splitting up the windows shown. The analog-to-digital device can be a personal computer card which performs the analog to digital conversion. Furthermore, an oscilloscope can be used, which is set up using a graphical user interface window, to acquire analog data from the test setup, and feeding this data to the computer. It is therefore contemplated that the appended claims will cover any such modification or embodiments that fall within the true scope of the invention.

I claim:

1. A computerized method for testing a wire harness assembly comprising the steps of:
   converting an analog response characteristic of a wire harness assembly over a time interval to a digital data set;
   selecting a first peak response value from said digital data set and marking a first time associated with said first peak response value;
   selecting a first zero value from said digital data set and marking a second time associated with said first zero value; and
   calculating an opening time by subtracting said second time from said first time;
indicating that the wire harness assembly is acceptable if the opening time is less than a critical time and that the wire harness assembly is unacceptable if the opening time is greater than the critical time.

2. The method of claim 1, wherein the method further comprises storing said digital data set.

3. The method of claim 1, wherein the method further comprises storing said opening time.

4. The method of claim 1, wherein the method further comprises the steps of:
   graphing the response characteristic as a function of time, and
   graphing the first digital data set as a function of time.

5. The method of claim 1 further including the steps of:
   displaying an input to the wire harness as an input function of time;
   displaying said response characteristic of the wire harness as a response function of time;
   moving a first cursor along said input function;
moving a second cursor along said response function based upon said movement of said first cursor.

6. A computerized testing method for testing a wire harness assembly comprising the steps of:
   converting an analog response characteristic of the wire harness assembly over a time interval to a digital data set;
   storing said digital data set;
   selecting a first peak response value from said digital data set and marking a first time associated with said first peak response value;
   selecting a first zero value from said digital data set and marking a second time associated with said first zero value; and
   calculating an opening time by subtracting said second time from said first time;

indicating that the wire harness assembly is operative if the opening time is less than a critical time and that the wire harness assembly is inoperative if the opening time is greater than the critical time.

7. The method of claim 6, wherein the method further comprises the steps of:

graphing the response characteristic as a function of time, and graphing the first digital data set as a function of time.

8. The method of claim 6, wherein the method further comprises storing said opening time.

9. A computerized test system for testing a wire harness, said system comprising:

an input for receiving an analog response characteristic of a wire harness over a time interval;

a computer comprising an analog-to-digital converter for converting said analog response characteristic to a digital data set;

a microprocessor programmed for selecting a first peak response value and a first zero value from said digital data set and calculating an opening time based on said values; and a memory device being coupled to the microprocessor, said memory device for storing the opening time.

10. The system of claim 9, wherein the computer further includes a monitor for displaying a graphical user interface, said interface for receiving instructions and information relating to the wire harness and displaying said digital data set, the graphical user interface including:

a first window for receiving, viewing, and selecting at least one test parameter for the wire harness; and a second window for initiating data sampling, data storing, data checking, and calculating results for the wire harness.

11. The graphical user interface of claim 10, wherein the first window further comprises a test setup section for entering a length of acquisition and a trigger current.

12. The graphical user interface of claim 10, wherein the second window further comprises a graphical display area for displaying graphs of the results.

13. The graphical user interface of claim 10, wherein the first window further comprises a test results section for displaying a plurality of calculated values.

14. The graphical user interface of claim 10, wherein the second window further comprises a test setup section for entering a length of acquisition and a trigger current.

15. The graphical user interface of claim 10, wherein the interface further comprises a third window for receiving and storing preexisting data on the design to be tested, said data being transferrable to the first window.

16. The graphical user interface of claim 12, wherein the second window further comprises a test setup section for entering a length of acquisition and a trigger current.

17. The graphical user interface of claim 11, wherein the first window further comprises a test results section for displaying a plurality of calculated values.

18. The system of claim 9 further including:

means for selecting a first peak response value from said digital data set and marking a first time associated with said first peak response value; and means for selecting a first zero value from said digital data set and marking a second time associated with said first zero value, said microprocessor calculating said opening time based upon said first time and said second time.

19. The system of claim 9 further including:

a display displaying an input to the wire harness as an input function of time and displaying said response characteristic of the wire harness as a response function of time;

a user input device for moving a first cursor along said input function; and means for moving a second cursor along said response function based upon said movement of said first cursor.

* * * * *